(12) United States Patent
Zhu et al.

(10) Patent No.: US 8,598,656 B2
(45) Date of Patent: Dec. 3, 2013

(54) METHOD AND APPARATUS OF FORMING ESD PROTECTION DEVICE

(75) Inventors: Ming Zhu, Singapore (TW); Lee-Wee Teo, Singapore (TW); Harry Hak-Lay Chuang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 255 days.

(21) Appl. No.: 12/719,720

(22) Filed: Mar. 8, 2010

(65) Prior Publication Data
US 2011/0215404 A1 Sep. 8, 2011

(51) Int. Cl.
*H01L 29/66* (2006.01)
(52) U.S. Cl.
USPC .................. 257/336; 257/355; 257/E21.619
(58) Field of Classification Search
USPC .............. 257/336, 355, E21.619, E29.256; 438/279
See application file for complete search history.

(56) References Cited

U.S. PATENT DOCUMENTS

| | | | |
|---|---|---|---|
| 6,455,894 B1* | 9/2002 | Matsumoto et al. | 257/347 |
| 2002/0127791 A1* | 9/2002 | Nanjo et al. | 438/231 |
| 2005/0056881 A1* | 3/2005 | Yeo et al. | 257/315 |
| 2006/0289936 A1* | 12/2006 | Kao | 257/357 |
| 2007/0138571 A1* | 6/2007 | Nakabayashi et al. | 257/371 |
| 2008/0211028 A1* | 9/2008 | Suzuki | 257/360 |

* cited by examiner

*Primary Examiner* — Chuong A Luu
*Assistant Examiner* — Nga Doan
(74) *Attorney, Agent, or Firm* — Haynes and Boone, LLP

(57) ABSTRACT

The present disclosure provides a semiconductor device having a transistor. The transistor includes a source region, a drain region, and a channel region that are formed in a semiconductor substrate. The channel region is disposed between the source and drain regions. The transistor includes a first gate that is disposed over the channel region. The transistor includes a plurality of second gates that are disposed over the drain region.

18 Claims, 11 Drawing Sheets

US 8,598,656 B2

METHOD AND APPARATUS OF FORMING ESD PROTECTION DEVICE

TECHNICAL FIELD

The present disclosure relates generally to a method of fabricating a semiconductor device, and more particularly, to a method of forming an electrostatic discharge (ESD) protection device.

BACKGROUND

The semiconductor integrated circuit (IC) industry has experienced rapid growth. Technological advances in IC materials and design have produced generations of ICs where each generation has smaller and more complex circuits than the previous generation. These circuits may be sensitive to electrostatic discharge (ESD) currents. Thus, ESD protection devices are utilized to prevent and reduce damages to an IC caused by ESD currents. Traditionally, an ESD protection device utilizes a silicide-blocking layer to prevent a silicide from forming on a drain region of the ESD device, thereby suppressing an ESD discharging current and preventing non-uniform turn-on issues in the ESD protection device. However, implementing the silicide-blocking layer increases fabrication costs and may require a larger chip area.

Therefore, while existing methods of fabricating ESD protection devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

SUMMARY

Figure 1:
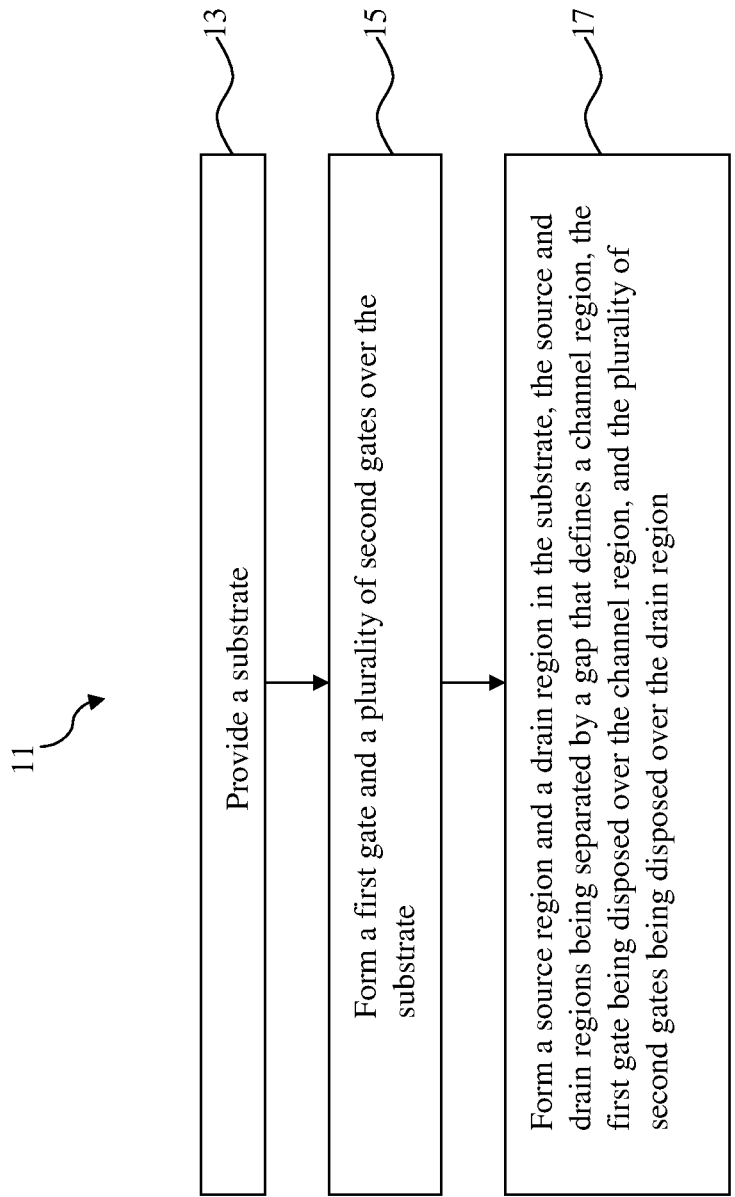
FIG. 1 is a flowchart illustrating a method of forming an ESD protection device according to various aspects of the present disclosure.

One of the broader forms of the present disclosure involves a semiconductor device that includes a transistor. The transistor includes, a source region, a drain region, and a channel region that is disposed between the source and drain regions; a first gate disposed over the channel region; and a plurality of second gates disposed over the drain region.

Another of the broader forms of the present disclosure involves a semiconductor device that includes a transistor. The transistor includes, a source region, a drain region, and a channel region that is disposed between the source and drain regions; a functional gate disposed over the channel region, the functional gate having a first gate length; and a dummy gate disposed over the drain region, the dummy gate having a second gate length that is smaller than the first gate length.

Still another of the broader forms of the present disclosure involves a method of fabricating a semiconductor device. The method includes, providing a substrate; forming a first gate and a plurality of second gates over the substrate; and forming a source region and a drain region in the substrate, the source and drain regions being separated by a gap that defines a channel region; wherein the forming the source and drain regions is carried out in a manner so that the first gate is disposed over the channel region, and the plurality of second gates are disposed over the drain region.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 11 for fabricating a semiconductor device. The method 11 begins with block 13 in which a substrate is provided. The method 11 continues with block 15 in which a first gate and a plurality of second gates are formed over the substrate. The method 11 continues with block 17 in which a source region and a drain region are formed in the substrate. The source and drain regions are separated by a gap that defines the channel region. The first gate is disposed over the channel region. The plurality of second gates are disposed over the drain region.

Figure 9:
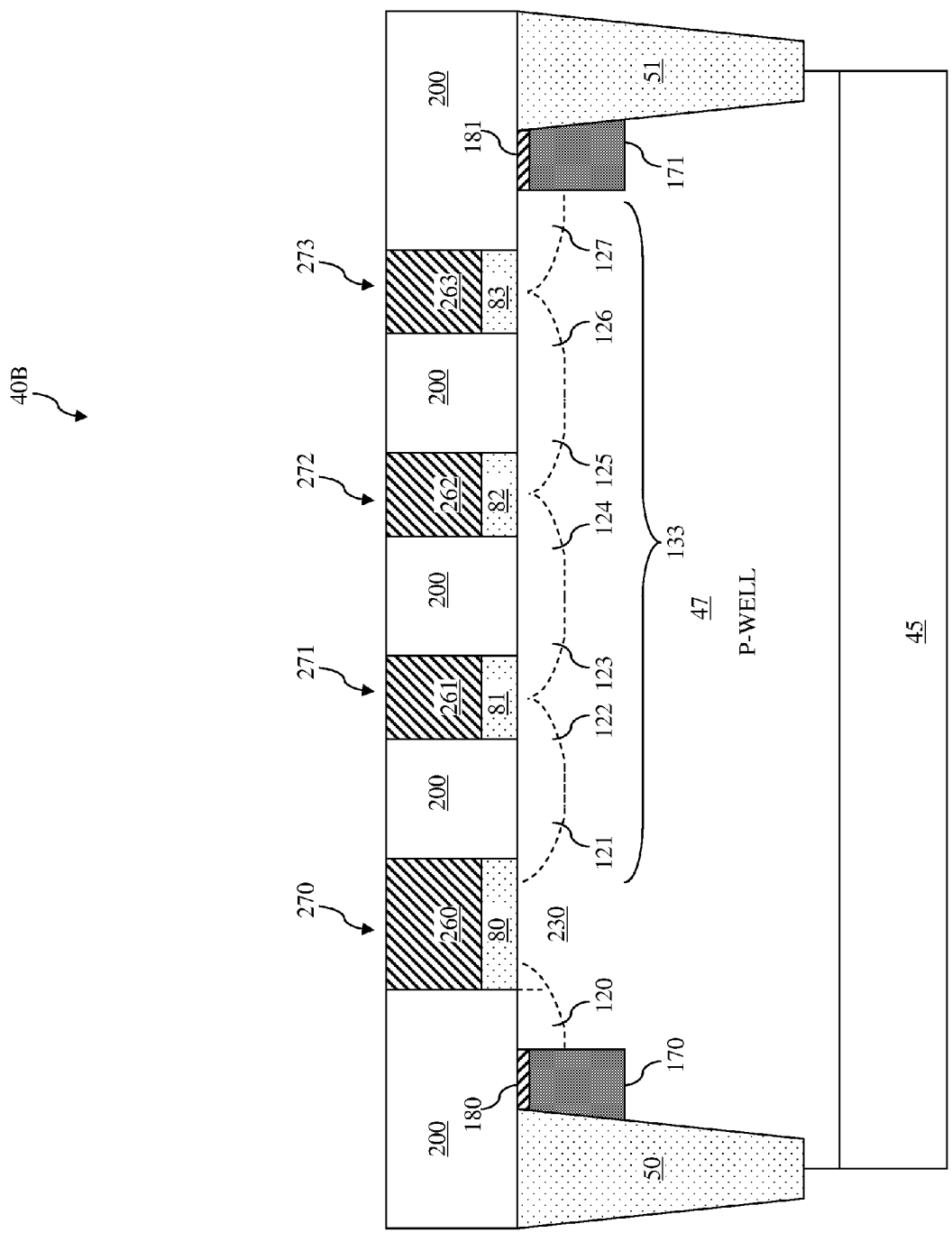
FIG. 9 is a diagrammatic fragmentary cross-sectional side view of the ESD protection device at one stage of fabrication in accordance with an alternative embodiment of the method of FIG. 1.
Figure 10:
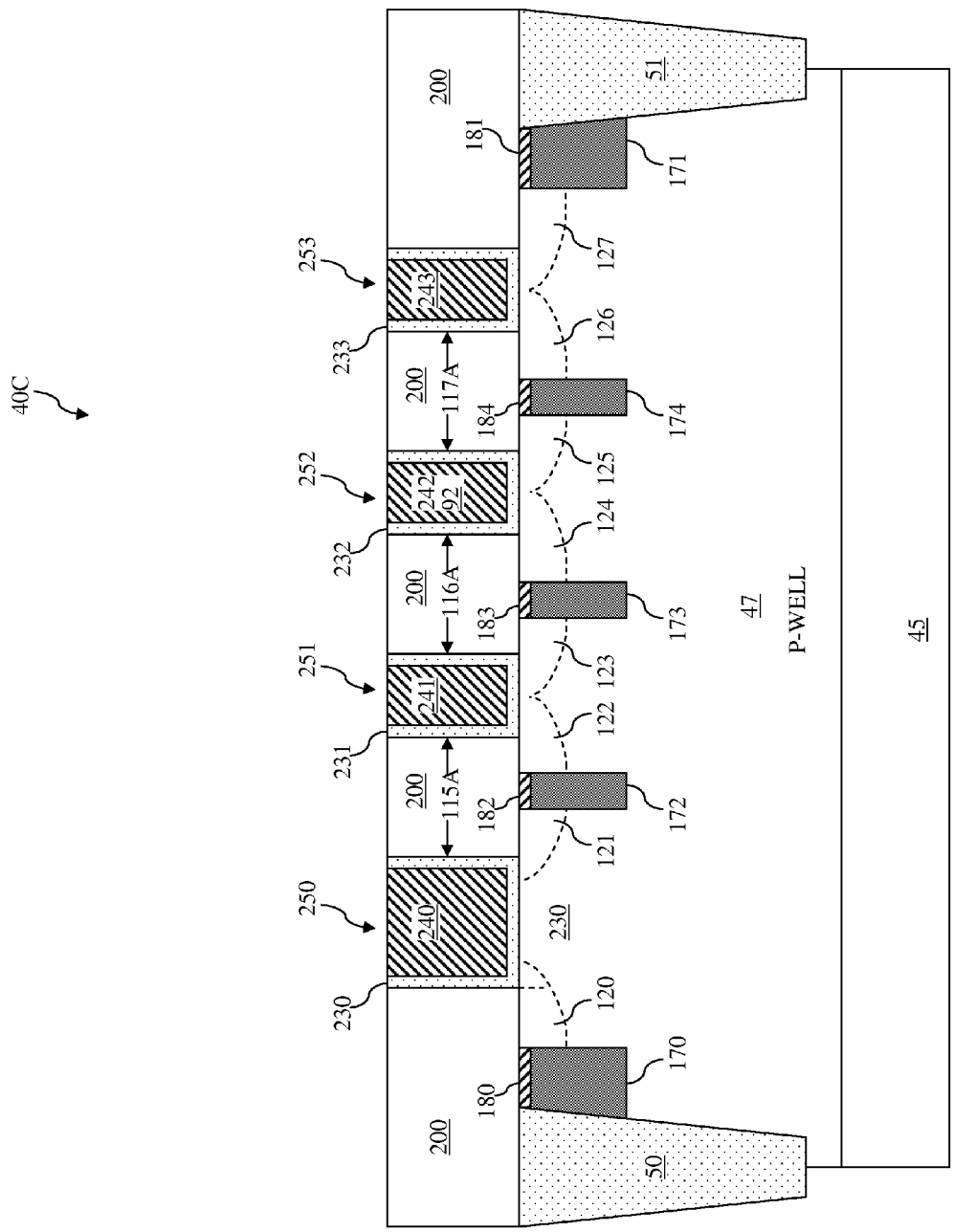
FIG. 10 is a diagrammatic fragmentary cross-sectional side view of the ESD protection device at one stage of fabrication in accordance with another alternative embodiment of the method of FIG. 1.
Figure 11:
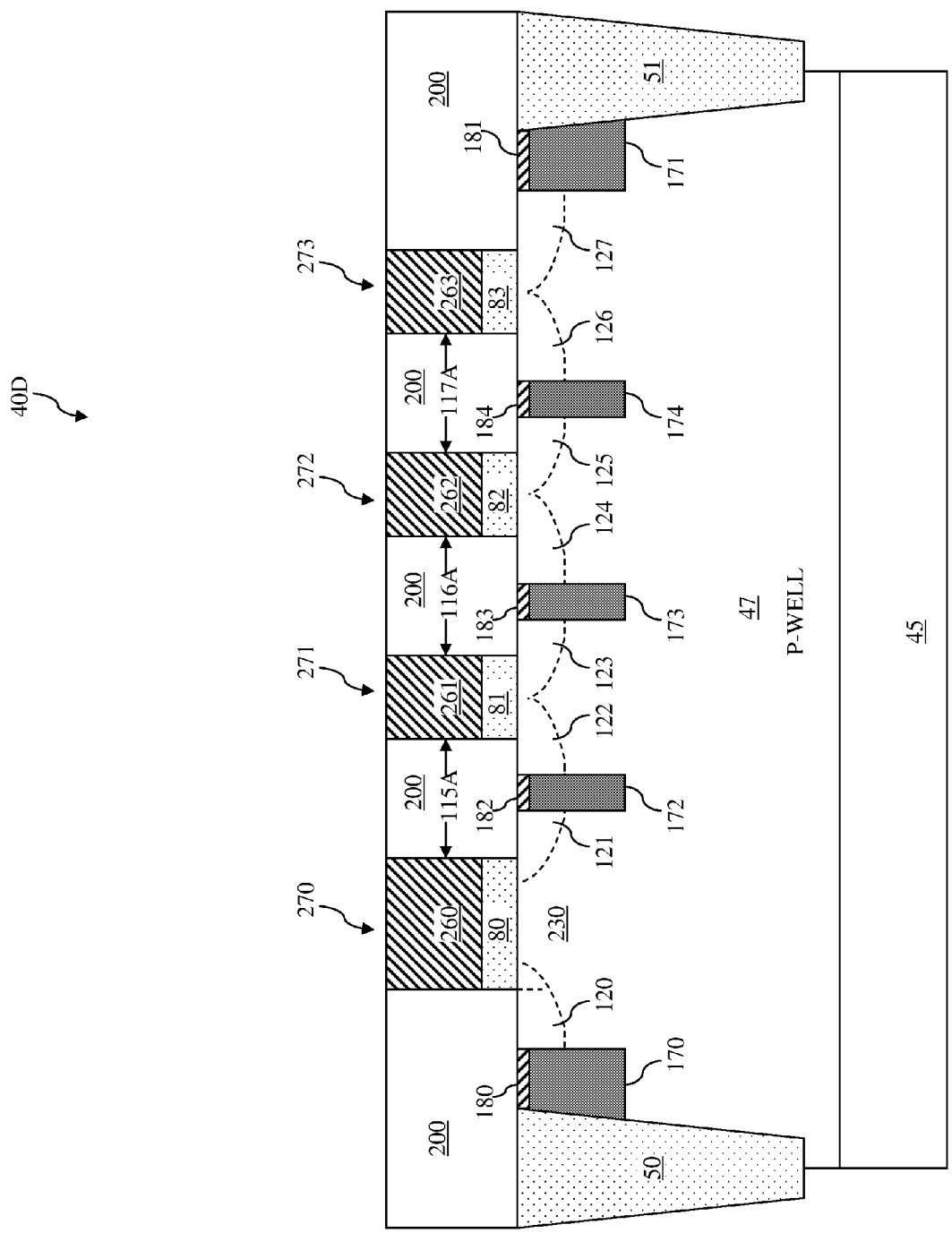
FIG. 11 is a diagrammatic fragmentary cross-sectional side view of the ESD protection device at one stage of fabrication in accordance with a further alternative embodiment of the method of FIG. 1.

FIGS. 2-8 are diagrammatic fragmentary cross-sectional side views of one embodiment of an ESD protection device 40A at various stages of fabrication in accordance with the method 11 of FIG. 1. FIG. 9 is a diagrammatic fragmentary cross-sectional side view of another embodiment of an ESD protection device 40B at a stage of fabrication in accordance with the method 11 of FIG. 1. FIG. 10 is a diagrammatic fragmentary cross-sectional side view of still another embodiment of an ESD protection device 40C at a stage of fabrication in accordance with the method 11 of FIG. 1. FIG. 11 is a diagrammatic fragmentary cross-sectional side view of yet another embodiment of an ESD protection device 40D at a stage of fabrication in accordance with the method 11 of FIG. 1. It is understood that FIGS. 2-11 have been simplified for a better understanding of the inventive concepts of the present disclosure. Accordingly, it should be noted that additional processes may be provided before, during, and after the method 11 of FIG. 1, and that some other processes may only be briefly described herein.

Figure 2:
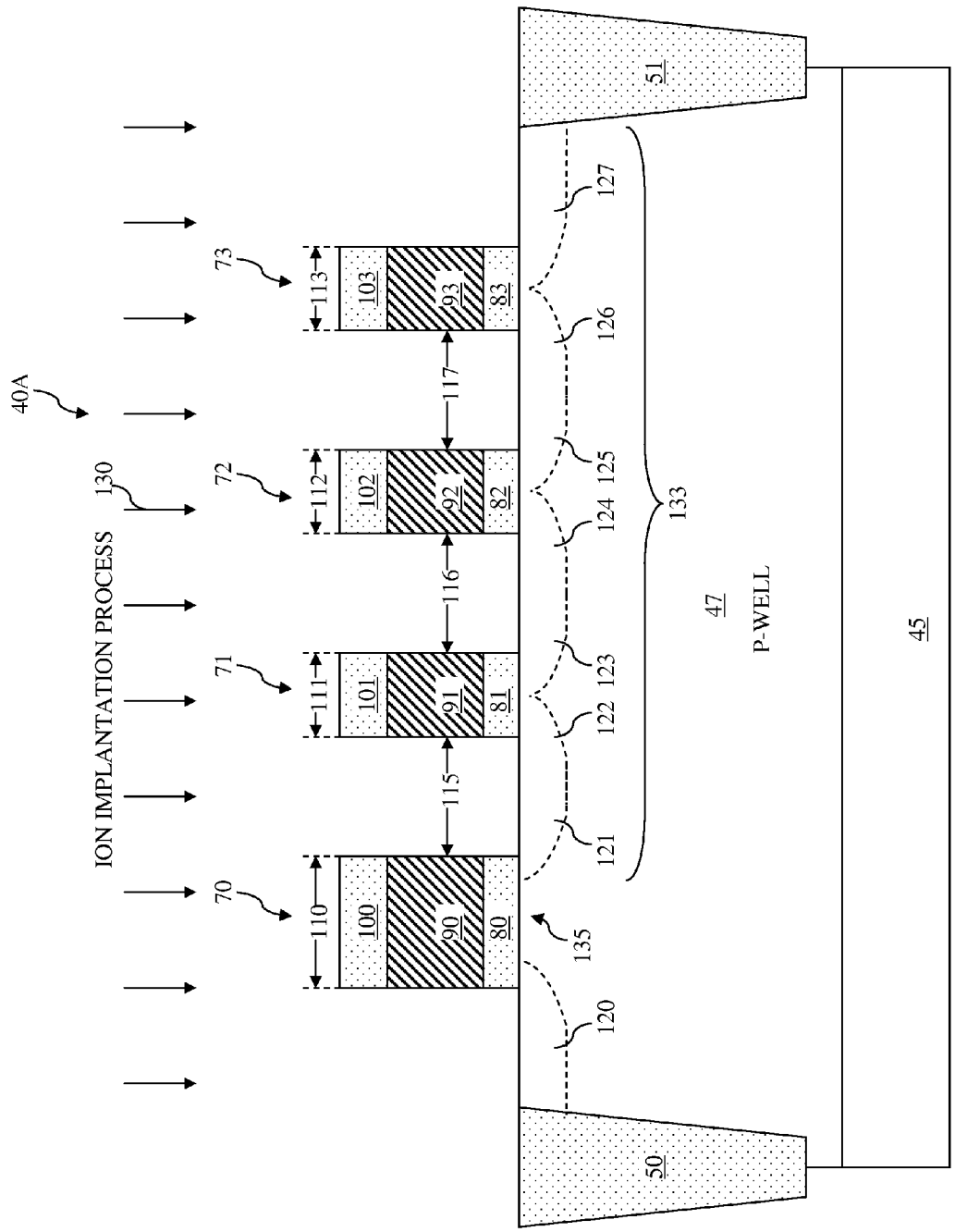
FIGS. 2-8 are diagrammatic fragmentary cross-sectional side views of the ESD protection device at various stages of fabrication in accordance with an embodiment of the method of FIG. 1.

Referring to FIG. 2, the ESD protection device 40A is an N-type transistor with a P-type substrate 45 that is doped with a P-type dopant such as boron. A P-well 47 is formed in the substrate 45. In another embodiment, the ESD protection device 40A may be a P-type transistor with an N-type substrate that is doped with an N-type dopant such as arsenic or phosphorous.

Referring back to FIG. 2, isolation structures 50 and 51 are formed in the substrate. In an embodiment, the isolation structures 50 and 51 are shallow trench isolation (STI) structures that include a dielectric material, which may be silicon oxide or silicon nitride. The P-well 47 is disposed in between the isolation structures 50 and 51.

Gate structures 70-73 are then formed over the substrate 45. The gate structures 71-73 are dummy gates for reasons that will be discussed below. It is understood that three of these dummy gate structures 71-73 are illustrated in FIG. 2 for purposes of facilitating ensuing discussions, and that other numbers of dummy gate structures may be formed in alternative embodiments.

The gate structures 70-73 include respective gate dielectric layers 80-83. In an embodiment, the gate dielectric layers 80-83 include silicon oxide. In another embodiment, the gate dielectric layers 80-83 include a high-k dielectric material. A high-k dielectric material is a material having a dielectric constant that is greater than a dielectric constant of $SiO_2$, which is approximately 4. For example, the high-k dielectric material may include hafnium oxide ($HfO_2$), which has a dielectric constant that is in a range from approximately 18 to approximately 40. Alternatively, the high-k material may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof.

The gate structures 70-73 also include respective gate electrode layers 90-93 that are respectively disposed over the gate dielectric layers 80-83. The gate electrode layers 90-93 include polysilicon. The gate structures 70-73 further include respective hard mask layers 100-103 that are respectively disposed over the gate electrode layers 90-93. The hard masks 100-103 include a dielectric material, such as silicon oxide or silicon nitride. Although not illustrated herein, the hard mask layers 100-103 were formed by patterning a hard mask material with a patterned photoresist layer. The hard mask layers 100-103 were then used to pattern the gate electrode layers 90-93 and the gate dielectric layers 80-83 therebelow so as to form the gate structures 70-73.

The gate structures 70-73 have respective gate lengths 110-113. The gate length 110 is in a range from approximately 300 nanometers (nm) to approximately 500 nm. The gate lengths 111-113 are in a range from approximately 20 nm to approximately 40 nm. In the embodiment shown in FIG. 2, the gate lengths 111-113 are each equal to approximately 30 nm, and the gate length 110 is equal to approximately 300 nm. Distances (or gaps) 115, 116, 117 separate the gate structures 70-71, 71-72, and 72-73, respectively. The distances 115-117 are equal to approximately 70 nm. In other words, a pitch—defined as the length of a gate structure and the distance separating adjacent gate structures—of the gate structures 70-73 is equal to approximately 100 nm.

After the gate structures 70-73 are formed, a lightly doped source region 120 and lightly doped drain regions 121-127 are formed in the P-well 47 through an ion implantation process 130. Specifically, the lightly doped source region 120 and the lightly doped drain region 121 are formed on either side of the gate structure 70, the lightly doped drain regions 122 and 123 are formed on either side of the gate structure 71, the lightly doped drain regions 124 and 125 are formed on either side of the gate structure 72, and the lightly doped drain regions 126 and 127 are formed on either side of the gate structure 73. The hard masks 100-103 protect portions of their respective gate structures 70-73 therebelow during the ion implantation process 130. A gap between the lightly doped source region 120 and the lightly doped drain region 121 defines a channel region 135, where electrical current will flow when the ESD protection device 40A is turned on.

The ion implantation process 130 in FIG. 2 uses an N-type dopant such as arsenic or phosphorous to dope the regions 120-127. In an alternative embodiment, the ion implantation process 130 may use a P-type dopant such as boron. The ion implantation process 130 also has a slight tilt angle and uses a relatively high implantation energy. In an embodiment, the tilt angle is in a range from approximately 7 degrees to approximately 10 degrees, and the implantation energy is in a range from approximately 7 kilo-electro volts (KeV) to approximately 15 Key. The slight tilt angle and the high implantation energy leads to lateral diffusion of the regions 120-127. As discussed above, the gate structures 71-73 have respective gate lengths 111-113 that are equal to approximately 30 nm in the present embodiment. Due in part to the relatively short gate lengths 111-113 and also to the lateral diffusion of the regions lightly doped drain regions 121-127, the lightly doped drain regions 121-127 merge together, which is also referred to as a "punch through" effect. As such, the lightly doped drain regions 121-127 form a single lightly doped drain region 133 that provides a continuous conductive path for the flow of electrical currents.

Figure 3:
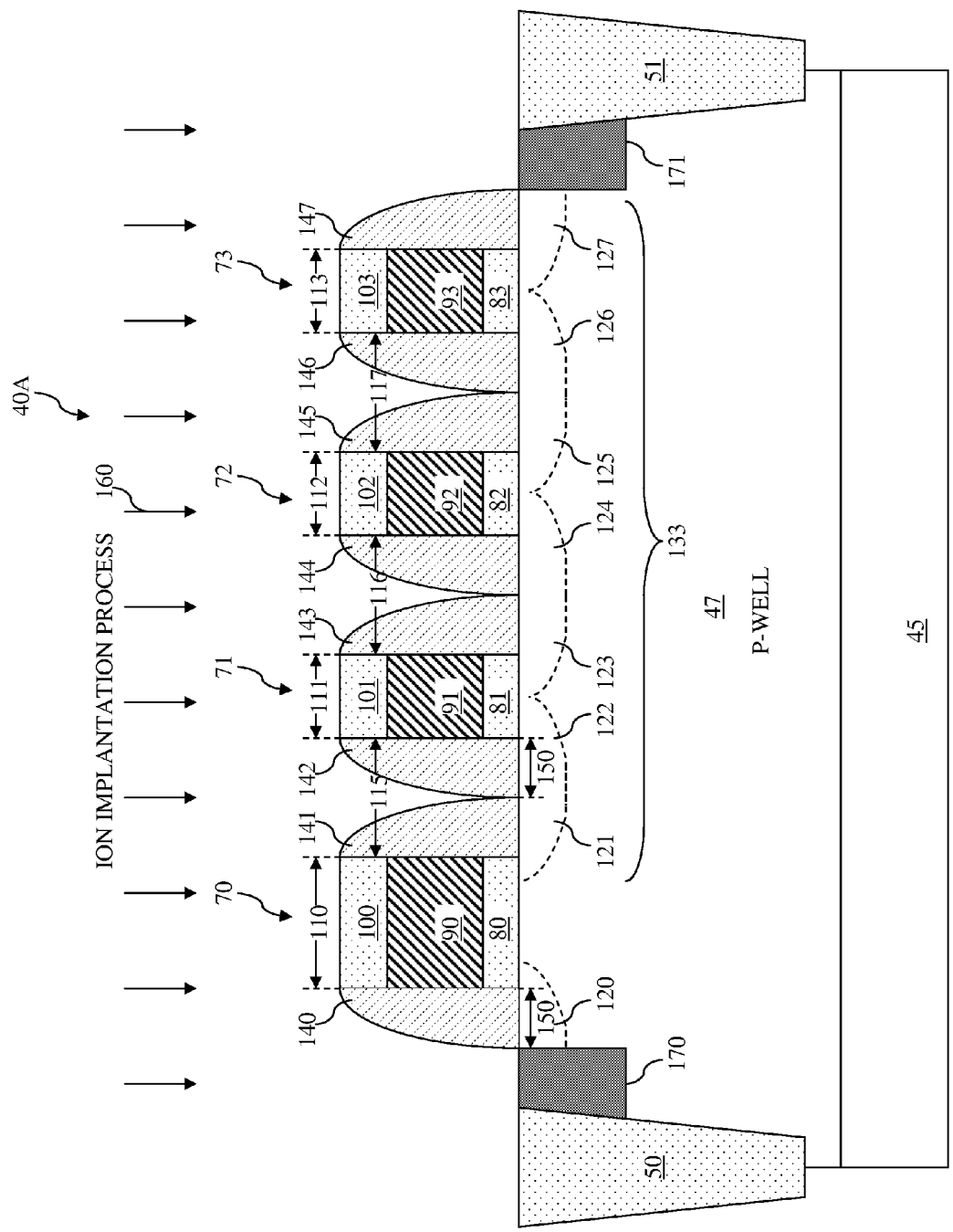

Referring now to FIG. 3, gate spacers 140 and 141 are formed on sidewalls of the gate structure 70, gate spacers 142 and 143 are formed on sidewalls of the gate structure 71, gate spacers 144 and 145 are formed on sidewalls of the gate structure 72, and gate spacers 146 and 147 are formed on sidewalls of the gate structure 73. The gate spacers 140-147 are formed using a deposition process and an etching process (for example, an anisotropic etching process) known in the art. The gate spacers 140-147 include a suitable dielectric material such as silicon nitride, silicon oxide, silicon carbide, silicon oxy-nitride, or combinations thereof. The gate spacers 140-141, 142-143, 144-145, and 146-147 may be considered parts of the gate structures 70-73, respectively.

The spacers 140-147 each have a spacer thickness 150 that is greater than or equal to one half of each of the distances 115-117. For example, in the present embodiment, the distances 115-117 are equal to approximately 70 nm. Thus, the spacers 140-147 have thicknesses 150 that is greater than or equal to approximately 35 nm. As such, the spacers 141 and 142 merge together, the spacers 143 and 144 merge together, and the spacers 145 and 146 merge together.

After the spacers 140-147 are formed, an ion implantation process 160 is performed on the ESD device 40A to form a heavily doped source region 170 and a heavily doped drain region 171. The heavily doped source region 170 is disposed between the isolation structure 50 and the spacer 140, and the heavily doped drain region 171 is disposed between the isolation structure 51 and the spacer 147. Since the dopants of the implantation process 160 cannot penetrate through the gate structures 70-73 and the spacers 140-147, the heavily doped source region 170 is self-aligned with the gate spacer 140 of the gate structure 70, and the heavily doped drain region 171 is self-aligned with the gate spacer 147 of the gate structure 73. The ion implantation process 160 uses an N-type dopant to dope the regions 170 and 171. In an alternative embodiment where the lightly doped drain region was doped with a P-type dopant, the ion implantation process uses a P-type dopant as well. The hard masks 100-103 and the spacers 140-147 protect regions of the P-well 47 therebelow during the implantation process 160, including the lightly doped source region 120 and the lightly doped drain region 133.

Figure 4:
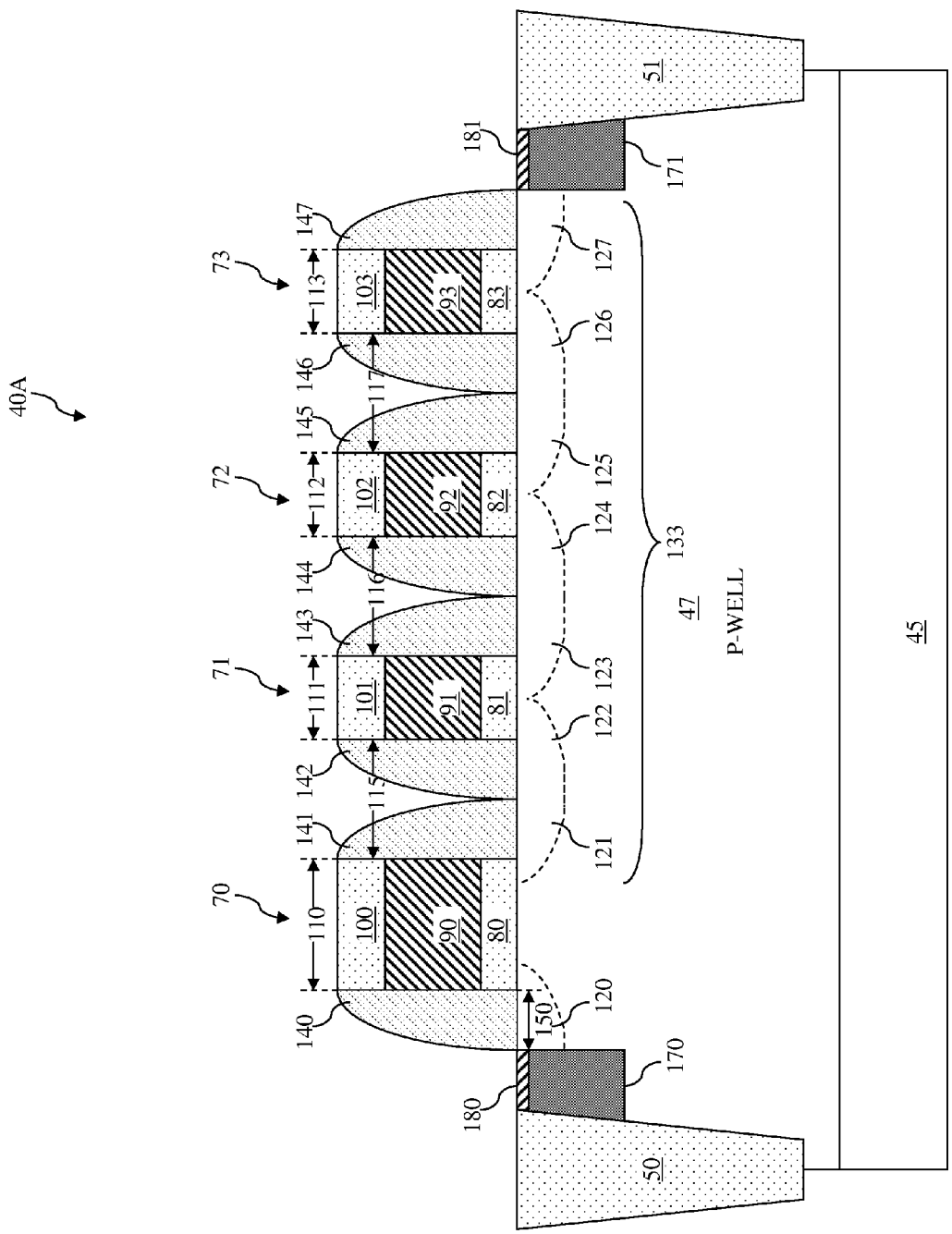

Referring now to FIG. 4, a silicidation process is performed on exposed surfaces of the heavily doped source region 170 and the heavily doped rain region 171 to form self-aligned silicides (also referred to as salicides) 180 and 181. The silicides 180 and 181 are respectively aligned with the spacers 140 and 147 since the heavily doped source region 170 and the heavily doped drain region 171 are respectively aligned with the spacers 140 and 147. The gate structures 70-73 and the spacers 140-147 serve as silicidation masks in the silicidation process, so that the surface of the lightly doped drain region 133 is not silicided. It is undesirable to have silicides formed on the surfaces of the lightly doped drain region 133 because an ESD discharging current would have been crowded within the silicides, which may cause non-uniform turn-on problems for the ESD protection device 40A.

Traditional methods do not form the gate structures 71-73 and the spacers 142-147, nor the lightly doped drain region 133. Instead, traditional methods typically form a long heavily doped drain region in place of the lightly doped drain region 133, and thereafter form a silicide-blocking layer, such as a resist-protection oxide (RPO) layer, to shield a portion of the surface of the long heavily doped drain region. Silicide would then be formed on the exposed portion of the surface of the heavily doped drain region.

However, there are several drawbacks associated with the traditional methods. First, forming a silicide-blocking layer requires an extra processing step and thus increases fabrication costs. Second, a resistivity of a heavily doped drain region is lower than a resistivity of a lightly doped drain region. As such, for any given unit length, the relatively long heavily doped drain region used by the traditional methods would have a relatively low drain resistance (also referred to as a ballast drain resistance), which is undesirable since a high drain resistance may be desired to limit the amount of current in the drain region. Consequently, to achieve a higher ballast drain resistance, ESD protection devices fabricated according to the traditional methods may require a longer drain length to compensate for the low resistivity in the drain. This increases fabrication costs and chip sizes. Third, the silicide-blocking layer may need to be accurately defined to cover only a desired portion of the surfaces of the heavily doped drain region. This places additional burdens on the photolithography tools used to form the silicide-blocking layer.

In comparison, the present embodiment offers many advantages, it being understood that different embodiments may offer different advantages, and that no particular advantage is required for any one embodiment. One advantage is that the gate structure 71-73 are formed in the same fabrication process as the gate structure 70, and the spacers 142-147 are formed in the same fabrication process as the spacers 140-141, thus the ESD protection device 40A fabricated according to the present embodiment incurs no extra fabrication cost. In other words, forming the gate structures 71-73 is fully compatible with existing fabrication process flows. Another advantage is that by forming the lightly doped drain region 133 adjacent to the heavily doped drain region 171, the ballast drain resistance is dominated by the relatively high resistance of the lightly doped drain region 133. Therefore, the ESD protection device 40A can achieve the same overall ballast drain resistance even with a shorter drain length. This results in smaller chip sizes and may further reduce fabrication cost per chip. Yet another advantage is that the heavily doped drain regions 170 and 171 are aligned with the spacers 140 and 147, respectively, thus the desired silicides 180 and 181 are self-aligned with the heavily doped drain regions 170 and 171, respectively. The gate structures 71-73 and the spacers 142-147 function as a blocking layer to prevent the silicidation of the surface of the lightly doped region 133. As such, the gate structures 71-73 and the spacers 142-147 are capable of performing the intended functions of the silicide-blocking layer of the traditional methods without placing burdens on the photolithography tool to achieve accurate alignment. Still another advantage of the present embodiment involves a chemical-mechanical-polishing (CMP) process that is to be performed later and will be discussed in more detail below.

Figure 5:
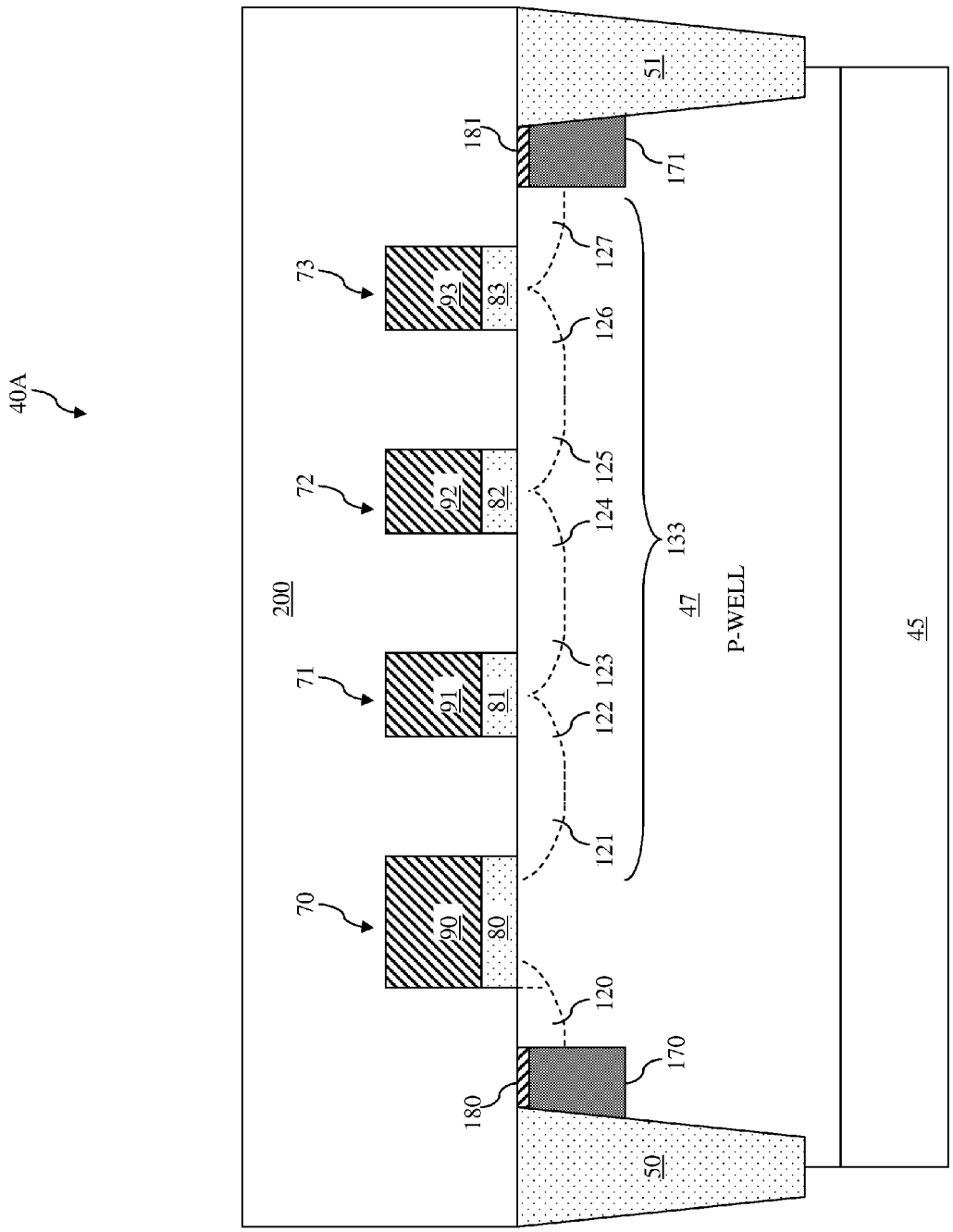

Referring now to FIG. 5, the spacers 140-147 and the hard mask layers 100-103 are removed and an inter-layer (or inter-level) dielectric (ILD) layer 200 is formed over the substrate 45, the isolation structures 50-51, and the gate structures 70-73. The ILD layer 200 may be formed by chemical vapor deposition (CVD), high density plasma CVD, spin-on coating, sputtering, or other suitable methods. In an embodiment, the ILD layer 200 includes silicon oxide. In other embodiments, the ILD layer 200 may include silicon oxy-nitride, silicon nitride, or a low-k material. In another alternative embodiment, the spacers 140-147 are only partially removed.

Figure 6:
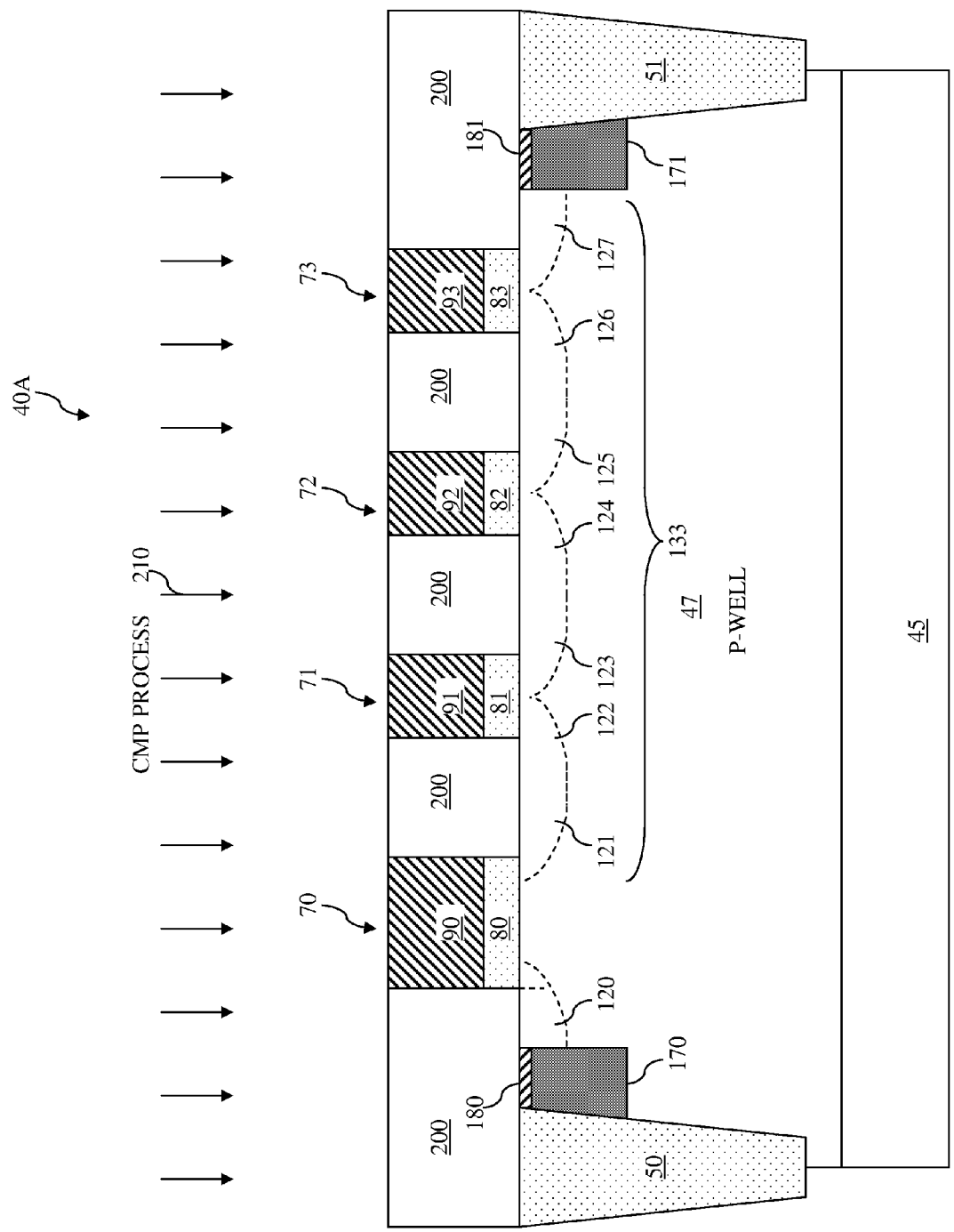

Referring to FIG. 6, a CMP process 210 is performed on the ILD layer 200 to expose a top surface of the gate structures 70-73. Following the CMP process 210, the top surfaces of the gate structures 70-73 are substantially co-planar with the top surface of the ILD layer 200 adjacent to the gate structures 70-73. Had the gate structures 71-73 not been formed, the CMP process 210 may suffer from a "CMP dishing effect", in which the polishing may result in a surface of the ESD protection device 40A that is not substantially even or flat. This is because the rate of polishing varies depending on the type of material that is being polished and/or the density of patterns on the substrate. Thus, the rating of polishing near the gate structure 70 may be different than the rate of polishing elsewhere in the ESD protection device 40A. Here, by implementing the gate structures 71-73, which all include similar types of materials, the rating of polishing is more evenly distributed throughout the ESD protection device 40A, and thus the CMP dishing effect is substantially reduced.

Although not illustrated, one or more annealing processes are performed on the ESD protection device 40A to activate the source regions 120 and 170 and the drain regions 133 and 171. These annealing processes may be performed before or after the CMP process 210.

Figure 7:
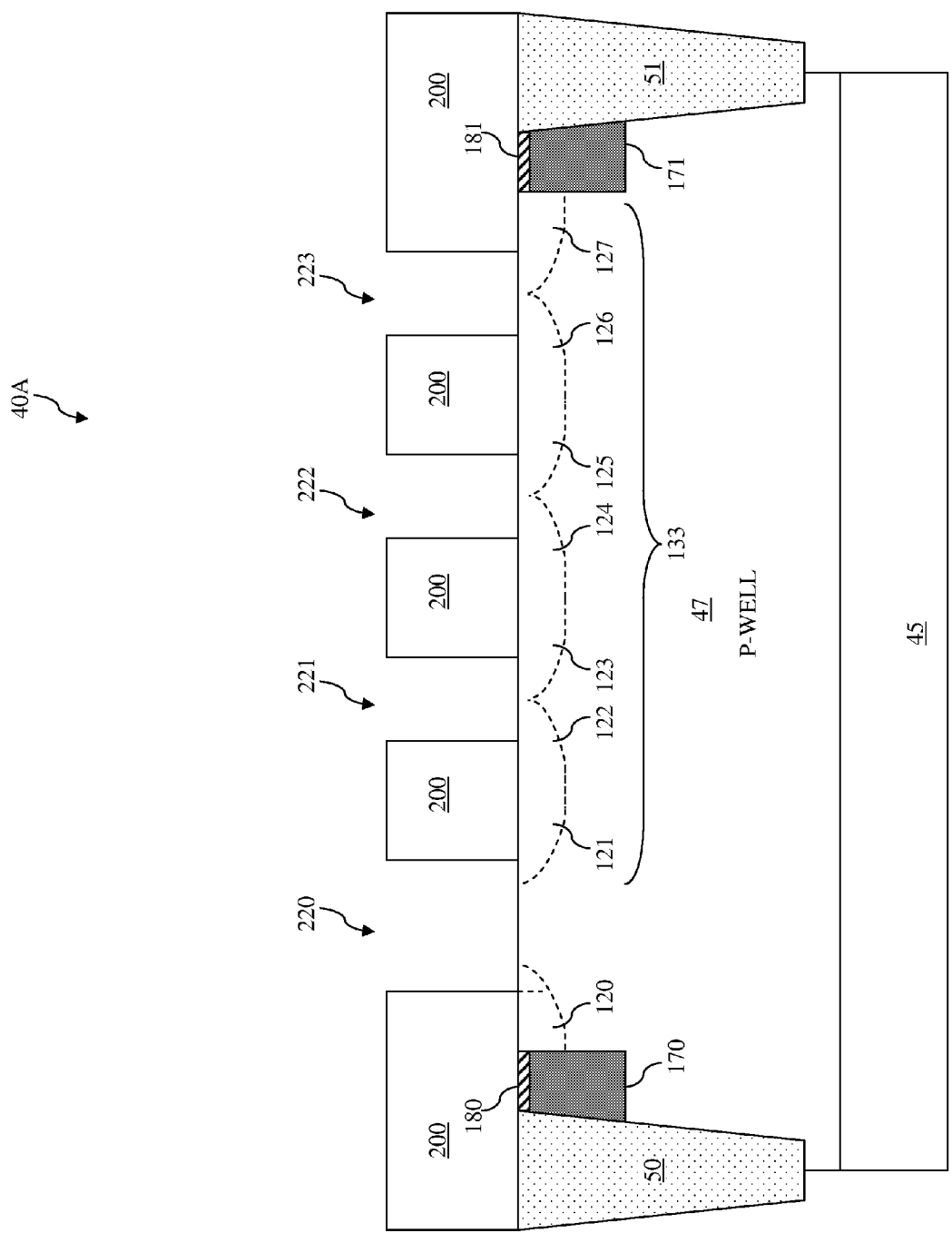

Referring now to FIG. 7, the gate structures 70-73 are removed, thereby forming trenches (or openings) 220-223 in place of the gate structures 70-73, respectively. The gate structures 70-73 may be removed in a wet etching or a dry etching process known in the art, while the rest of the layers of the ESD protection device 40A remain substantially unetched, including the ILD layer 200. This is performed in accordance with a "high-k last" approach. In an alternative embodiment, the gate dielectric layers 80-83 include the high-k dielectric material (instead of silicon oxide) as discussed above and are not removed. This alternative embodiment is performed in accordance with a "gate-last" approach and will be discussed in more detail further below.

Figure 8:
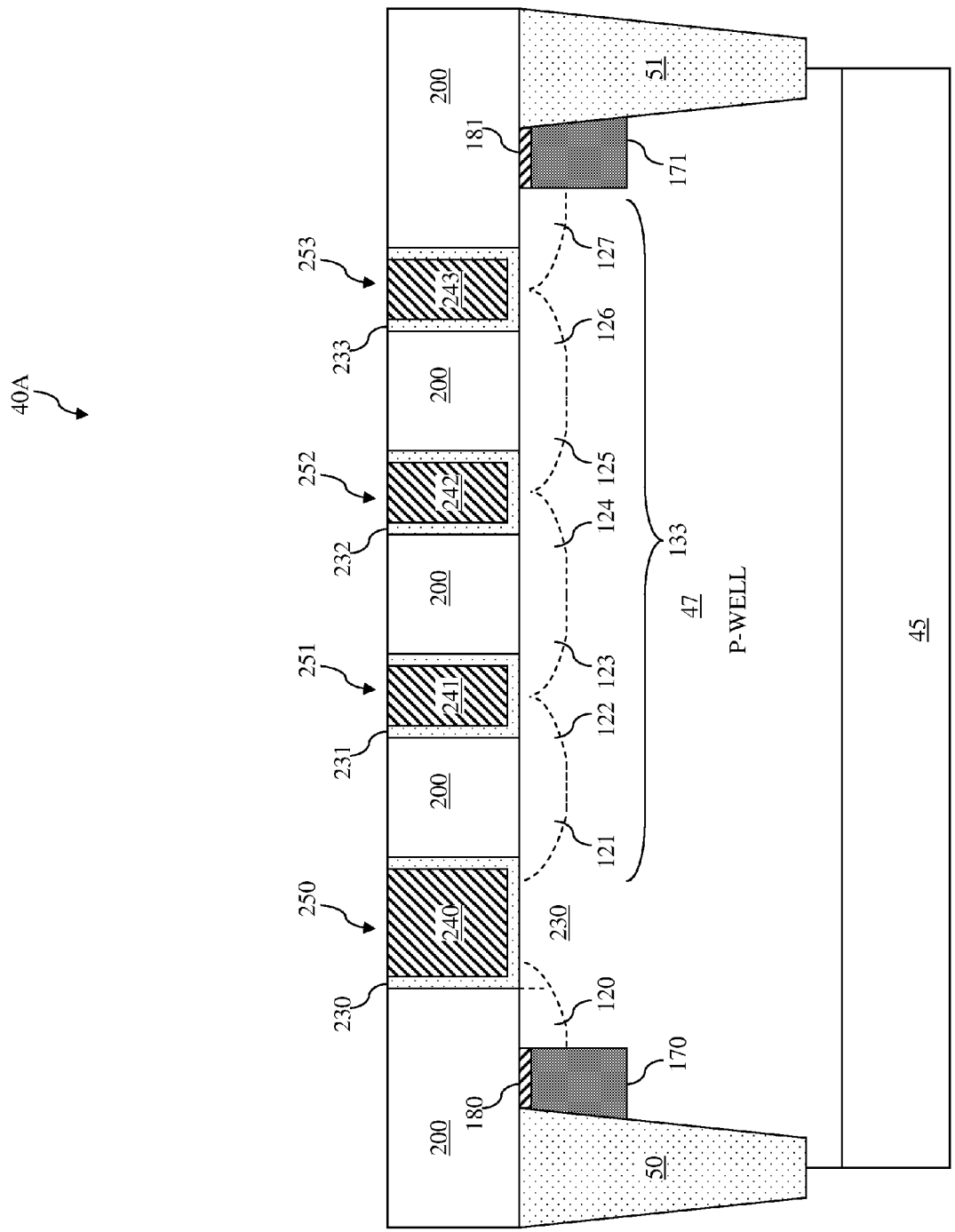

Referring now to FIG. 8, high-k gate dielectric layers 230-233 are formed in the trenches 220-223, respectively. The high-k gate dielectric layers 230-233 include the high-k dielectric material as discussed above. Although not illustrated, it is understood that an interfacial layer may be formed in the trenches 220-223 before the high-k gate dielectric layers 230-233 are formed.

Thereafter, gate electrodes 240-243 are respectively formed within the trenches 220-223 and over the high-k gate dielectric layers 230-233. The gate electrodes 240-243 may be formed by CVD, physical vapor deposition (PVD), or another suitable technique. The gate electrodes 240-243 each include a work function metal portion and a fill metal portion. The work function metal portion of the gate electrode 240 is an N-type work function metal (N-metal), which may be Ti, Al, Ta, $ZrSi_2$, TaN, or combinations thereof. The work function metal portion of the gate electrodes 241-243 are a P-type work function metal (P-metal), which may be Mo, Ru, Jr, Pt, PtSi, MoN, WNx, or combinations thereof. The work function metal portions of the gate electrodes 240-243 each have a respective range of work function values that are associated with the material composition of the work function metal gate electrodes. The work function values can be used to tune a work function of the ESD protection device 40A so that a desired threshold voltage $V_t$ for each of the gate structures 251-253 is achieved. For example, the work function values of the work function metal portions of the gate electrodes 241-243 may be tuned in a manner to achieve a desired ballast resistance of the lightly doped drain region 133. A higher threshold voltage $V_t$ for the gate structures 251-253 results in a higher ballast drain resistance, and vice versa. In other words, the material composition of the work function gate electrodes are correlated with the ballast resistance of the lightly doped drain region 133. Fill metal portions of the gate electrodes 240-243 include one of tungsten (W), Aluminum (Al), copper (Cu), and combinations thereof, and respectively serve as the main conductive portions of the gate electrodes 240-243.

Gate structures 250-253 are formed by the high-k gate dielectric layers 250-253 and the gate electrodes 240-243, respectively. The gate structure 250 serves as a functional gate structure of the ESD protection device 40A. The gate structures 251-253 serve as dummy gate structures of the ESD protection device 40A in the sense that the gate structures 251-253 are not used to turn on the ESD protection device 40A.

FIG. 9 is a fragmentary diagrammatic cross-sectional side view of an alternative embodiment of the ESD protection device 40B. The ESD protection device 40B is similar to the ESD protection device 40A discussed above and illustrated in FIGS. 2-8. Thus, similar features will be labeled the same for the sake of simplicity and clarity. The ED protection device 40B is fabricated using a "gate-last" approach. Under the "gate-last" approach, the gate dielectric layers 80-83 include the high-k dielectric material and would not have been removed when the gate electrode layers 90-93 were removed, thus the high-k gate dielectric layers 230-233 (FIG. 8) need not be formed in this alternative embodiment. After the removal of the gate electrode layers 90-93, gate electrodes 260-263 are formed over the high-k dielectric layers 80-83, respectively. The gate electrodes 260-263 are similar to the gate electrodes 240-243 (FIG. 8) described above. Thus, gate structures 270-273 are formed by the high-k gate dielectric layers 80-83 and the gate electrodes 260-263, respectively. The gate structure 270 is a functional gate structure of the ESD protection device 40B, and the gate structures 271-273 serve as dummy gate structures. As such, the gate-last embodiment of the ESD protection device 40B illustrated in FIG. 9 has similar advantages as the high-k last embodiment described above with reference to FIGS. 2-8.

FIG. 10 is a fragmentary diagrammatic cross-sectional side view of another alternative embodiment of the ESD protection device 40C. In this embodiment, the fabrication processes are substantially similar to the high-k last embodiment described above with reference to FIGS. 2-8. Thus, similar features will be labeled the same for the sake of simplicity and clarity. For the ESD protection device 40C, the distances 115A, 116A, and 117A that respectively separate the gate structures 250-251, 251-252, and 252-253 are each equal to approximately 100 nm, instead of 70 nm. Alternatively stated, the pitch of the gate structures 250-253 is equal to approximately 130 nm instead of 100 nm. Due to the longer pitch, the spacers 141-142, 143-144, and 145-146 (FIGS. 3-4, not illustrated herein) do not overlap, and consequently heavily doped drain regions 172-174 are formed by an ion implantation process similar to the ion implantation process 160 in FIG. 3. Thus, the heavily doped drain regions 172-174 are formed at the same time that the heavily doped source region 170 and the heavily doped drain region 171 are formed. Thereafter, silicides 182-184 are respectively formed on the surfaces of the heavily doped drain regions 172-174, at the same time that the silicides 180 and 181 are formed.

The embodiment shown in FIG. 10 also utilizes the high-k last approach employed by the embodiment shown in FIGS. 2-8 but involves some tradeoff considerations between ballast drain resistance and fabrication concerns. More specifically, the shorter pitch in the embodiment shown in FIGS. 2-8 may put constraints on the fabrication processes, including the photolithography processes used to accurately define the gate structures 70-73 (FIGS. 2-6) having such a small pitch. In comparison, the longer pitch in the embodiment shown in FIG. 10 allows these constraints to be relaxed. Though the presence of the heavily doped drain regions 172-174 may reduce the ballast drain resistance, the overall ballast drain resistance is still higher compared to ESD protection devices formed by traditional processes, since the highly resistive lightly doped drain regions 121-127 dominate the ballast drain resistance. Further, the distances 115A-117A may be used to tune the ballast drain resistance. As the distances 115A-117A increase, the length of the heavily doped drain regions 172-174 increase, and the lengths of the lightly doped drain regions 121-127 decrease. This lessens the contribution of the resistance of the lightly doped drain regions 121-127 to the overall ballast drain resistance, and as such reduces the overall ballast drain resistance. Conversely, as the distances 115A-117A decrease, the overall ballast drain resistance would increase. In other words, the distances 115A-117A— the spacing between the dummy gate structures 251-253— are correlated with the overall ballast drain resistance of the ESD protection device 40C.

FIG. 11 is a fragmentary diagrammatic cross-sectional side view of yet another alternative embodiment of the ESD protection device 40D. In this embodiment, the fabrication processes are substantially similar to the gate last embodiment described above with reference to FIG. 9. Thus, similar features will be labeled the same for the sake of simplicity and clarity. Also similar to the embodiment shown in FIG. 10, the distances 115A, 116A, and 117A that respectively separate the gate structures 270-271, 271-272, and 272-273 are each equal to approximately 100 nm, instead of 70 nm. Consequently, heavily doped drain regions 172-174 and silicides 182-184 are formed as well. In other words, the embodiment shown in FIG. 11 is a combination of the embodiment shown in FIG. 9 and the embodiment shown in FIG. 10. Thus, the embodiment shown in FIG. 11 also involves a small trade-off between fabrication process requirements versus ballast drain resistance.

It is understood for each of the embodiments shown above, additional processes may be performed to complete the fabrication of the ESD protection device 40. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the ESD protection device may not be limited to an NMOS device and can be extended to a PMOS device with a similar structure and configuration except that all doping types may be reversed and dimensions are modified according to PMOS design. Further, the PMOS device may be disposed in a deep n-well pocket for isolating the device.

What is claimed is:

1. A semiconductor device, comprising a transistor that includes:
    a source region, a drain region, and a channel region that is disposed between the source and drain regions, wherein the drain region is a continuous region;
    a first gate disposed directly over the channel region; and
    a plurality of second gates disposed directly over the drain region.

2. The semiconductor device of claim 1, wherein the drain region includes a lightly doped drain region and a heavily doped drain region, the second gates being disposed over the lightly doped drain region, and the heavily doped drain region having a silicide layer disposed thereon.

3. The semiconductor device of claim 1, wherein the first gate has a first gate length, and wherein the second gates each have a respective second gate length that is smaller than the first gate length.

4. The semiconductor device of claim 3, wherein the first gate length is in a range from approximately 300 nanometers to approximately 500 nanometers, wherein the second gate lengths are each in a range from approximately 20 nanometers to approximately 40 nanometers, and wherein each of the second gates is spaced apart from adjacent second gates by approximately 70 nanometers.

5. The semiconductor device of claim 1, wherein the drain region includes a plurality of lightly doped drain regions and a plurality of heavily doped drain regions, the lightly doped drain regions being interleaved with the heavily doped drain regions, each of the second gate being disposed over a respective one of the lightly doped drain regions, and the heavily doped drain regions each having a silicide layer disposed thereon.

6. The semiconductor device of claim 1, wherein the first gate includes a first gate dielectric and a first gate electrode, and the second gates each include a second gate dielectric and a second gate electrode, and wherein:
    the first gate dielectric includes a high-k material;
    the first gate electrode includes a metal gate electrode of a first type;
    the second gate dielectric includes one of an oxide material and a high-k material; and
    the second gate electrode includes one of a polysilicon gate electrode and a metal gate electrode of a second type that is opposite from the first type.

7. The semiconductor device of claim 1, wherein each of the second gates is spaced apart from adjacent second gates by a distance, wherein the second gates each include a work function metal gate electrode having a material composition, and wherein the drain region has a resistance that is correlated to one of the distance and the material composition of the work function metal gate electrode.

8. A semiconductor device, comprising a transistor that includes:
    a source region, a drain region, and a channel region that is disposed between the source and drain regions;
    a functional gate disposed over the channel region, the functional gate having a first gate length; and
    a dummy gate disposed over the drain region in a manner such that at least a portion of the drain region lies underneath an entire bottom surface of the dummy gate, the dummy gate having a second gate length that is smaller than the first gate length.

9. The semiconductor device of claim 8, wherein:
    the source region includes a lightly doped source region and a heavily doped source region;
    the drain region includes a heavily doped drain region and a lightly doped drain region, the dummy gate being disposed over the lightly doped drain region;
    the functional gate has a metal gate electrode of a first type; and
    the dummy gate has one of a polysilicon gate electrode and a metal gate electrode of a second type that is different from the first type.

10. The semiconductor device of claim 8, further including a further dummy gate disposed over the drain region, the dummy gate and the further dummy gate being separated by a distance that is less than approximately 100 nanometers, and wherein the second gate length is in a range from approximately 20 nanometers to approximately 40 nanometers.

11. The semiconductor device of claim 8, wherein the dummy gate includes a metal gate electrode, and wherein the drain region has a resistance that is correlated to a material composition of the metal gate electrode.

12. A semiconductor device, comprising:
    a substrate;
    a first gate and a plurality of second gates over the substrate, wherein the first gate has a first gate length, and wherein the second gates have respective second gate lengths smaller than the first gate length; and
    a source region and a drain region in the substrate, the source and drain regions being separated by a gap that defines a channel region, wherein the drain region is a continuous region;
    wherein the forming the source and drain regions is carried out in a manner so that the first gate is disposed over the channel region, and the plurality of second gates are disposed directly over the drain region.

13. The device of claim 12, wherein the drain region includes a lightly doped drain region and a heavily doped drain region, the second gates being disposed over the lightly doped drain region, and further including a silicide over the heavily doped drain region.

14. The device of claim 12, wherein the first gate has a first gate length and the second gates have second gate length that is smaller than the first gate length.

15. The device of claim 14, wherein the first gate length is in a range from approximately 300 nanometers to approximately 500 nanometers and the second gate lengths are each in a range from approximately 20 nanometers to approximately 40 nanometers; and each of the second gates is spaced apart from adjacent second gates by approximately 70 nanometers.

16. The device of claim 12, wherein the drain region includes a plurality of lightly doped drain regions and a plurality of heavily doped drain regions, the lightly doped drain regions interleaving with the heavily doped drain regions, each of the second gates being disposed over a respective one of the lightly doped drain regions, and further including silicides over the heavily doped drain regions.

17. The device of claim 12, wherein the first gate are formed by a gate-last process.

18. The device of claim 17, wherein the first gate length is in a range from approximately 300 nanometers to approximately 500 nanometers and the second gate lengths are each in a range from approximately 20 nanometers to approximately 40 nanometers; and each of the second gates is spaced apart from adjacent second gates by approximately 100 nanometers.

\* \* \* \* \*